(12) United States Patent
Nedjimi et al.

(10) Patent No.: US 11,289,929 B2
(45) Date of Patent: Mar. 29, 2022

(54) METHOD FOR EVALUATING A STATE OF CHARGE OF A RECHARGEABLE BATTERY

(71) Applicant: Volvo Construction Equipment AB, Eskilstuna (SE)

(72) Inventors: Ahcène Nedjimi, Lyons (FR); Lilian Bruyere, Belley (FR); François Savoye, Miribel (FR); Yann Pinaroli, Aoste (FR)

(73) Assignee: Volvo Construction Equipment AB, Eskilstuna (SE)

( * ) Notice: Subject to any disclaimer, the term of this patent is extended or adjusted under 35 U.S.C. 154(b) by 52 days.

(21) Appl. No.: 16/971,955

(22) PCT Filed: Feb. 23, 2018

(86) PCT No.: PCT/EP2018/054507
§ 371 (c)(1),
(2) Date: Aug. 21, 2020

(87) PCT Pub. No.: WO2019/161909
PCT Pub. Date: Aug. 29, 2019

(65) Prior Publication Data
US 2020/0395776 A1    Dec. 17, 2020

(51) Int. Cl.
*H02J 7/00* (2006.01)
*G01R 31/3842* (2019.01)
*B60L 58/12* (2019.01)

(52) U.S. Cl.
CPC ............ *H02J 7/0048* (2020.01); *B60L 58/12* (2019.02); *G01R 31/3842* (2019.01);
(Continued)

(58) Field of Classification Search
CPC .... H02J 7/0013; H02J 2207/20; H02J 7/0048; B60L 2210/10; B60L 58/12; B60L 2200/40; Y02T 10/70; G01R 31/3842
See application file for complete search history.

(56) References Cited

U.S. PATENT DOCUMENTS

2016/0304041 A1* 10/2016 Lennevi .................... B60L 1/00
2017/0253140 A1*  9/2017 Chang ..................... B60L 58/12
(Continued)

OTHER PUBLICATIONS

International Search Report and Written Opinion of the International Searching Authority, PCT/EP2018/054507, dated Dec. 5, 2018, 10 pages.

*Primary Examiner* — Jared Fureman
*Assistant Examiner* — Duc M Pham
(74) *Attorney, Agent, or Firm* — Sage Patent Group

(57) ABSTRACT

A method for evaluating a state of charge of a rechargeable battery of an electrical system. The electrical system includes one primary power source and a rechargeable battery as a secondary power source, a DC/DC converter and an electrical network comprising a primary electrical network that connects the primary power source to the DC/DC converter and a secondary electrical network that connects the rechargeable battery to at least the DC/DC converter. The DC/DC converter converts an input DC voltage supplied by the at least one primary power source into an output DC voltage supplied to the secondary electrical network. The at least one primary power source and the rechargeable battery are connected in parallel to at least one electrical load and are configured to supply, via the electrical network, DC voltage and DC current to the electrical load.

16 Claims, 2 Drawing Sheets

(52) U.S. Cl.
CPC ....... *B60L 2200/40* (2013.01); *B60L 2210/10* (2013.01); *H02J 2207/20* (2020.01)

(56) References Cited

U.S. PATENT DOCUMENTS

2017/0297440 A1* 10/2017 Hu .......................... B60L 50/15
2018/0241225 A1*  8/2018 Shirai ................... H02J 7/0029

* cited by examiner

METHOD FOR EVALUATING A STATE OF CHARGE OF A RECHARGEABLE BATTERY

TECHNICAL FIELD

The invention relates to the field of batteries; it relates more specifically to a method to diagnose the state of charge of a low-voltage rechargeable battery embedded in a high-voltage network supplied by a high-voltage power source.

BACKGROUND

When multiple electrical power sources are used in parallel as a power source system, some of the power sources outputs are controllable to some extent while other power sources do not have embedded diagnostics, or are not able to communicate their status. In some situations, it becomes crucial to be able to identify the state of the power sources. For example, on construction machinery, the EN 474-1 regulation obliges to be able to lower to the ground the equipment when the machine is stopped. When a machine is composed of a hydraulic system, this operation could be done even after having stopped the engine, thanks to the residual pressure system that is planned for that situation. When the machine is a hybrid or an electric machine comprising electrical actuators, the electric machine is commonly powered by a primary power source to power, for instance, via a primary electrical network, electric actuators, and a secondary power source to power, via a secondary electrical network, low loads such as radio, lights inside the cabin, heaters, air conditioning system, control units of the electric machine . . . . If failure of the secondary power source occurs, it becomes impossible to comply with the regulation once the primary power source has been shutdown. Indeed, when the primary power source has been shutdown, that is to say disconnected from the primary electrical network, and in case of a failure of the secondary power source, it will be impossible to start the primary power source. In other words, in case of a failure of the secondary power source it will become impossible to connect the primary power source to the primary electrical network. This is due to the fact that the connection of the primary power source with the primary electrical network is usually performed via an electric contactor that is controlled by an ECU powered by the secondary electrical network. As a consequence, it would be impossible to lower again the equipment to the ground as requested by the above regulation.

The primary power source is usually able to deliver a voltage that is higher than the secondary power source and is commonly called a high-voltage power source. The secondary power source is commonly called a low-voltage power source.

More specifically, we are considering an electrical system comprising at least a high-voltage electrical network supplied by a high-voltage power source, and a low-voltage electrical network, the low-voltage electrical network being supplied by the high-voltage power source through a DC/DC (direct current to direct current) converter and/or by a low voltage source such as a rechargeable battery. The rechargeable battery can be used to restart the electrical system after the high power source has been shutdown. Besides, the rechargeable battery can be used as backup for the high power network. As illustrated by the previous example, in certain situations it is vital to know what the state of charge of the rechargeable battery is, before stopping the system.

For diagnosing the state of charge of the rechargeable battery, it is known to feed it with electrical current or voltage pulses and to evaluate the temporal profile of the voltage or current output from the battery. This strategy requires specific electrical circuits and sensors to be added to already complex systems.

It is also known to use a battery charge controller, but this solution is expensive, and would imply a service interruption to perform the diagnosis.

SUMMARY

There is a need for simpler solutions which enable diagnosis of a battery which has no embedded diagnostic means, and/or which do not communicate such diagnostic; moreover, it must be possible to perform the diagnosis on the live system without service interruption.

An object of the invention is to provide a solution to this problem.

The present invention provides a method for evaluating a state of a charge of a rechargeable battery of an electrical system, said electrical system comprising at least one primary power source and a rechargeable battery as a secondary power source, a DC/DC converter and an electrical network comprising a primary electrical network that connects the primary power source to at least the DC/DC converter and a secondary electrical network that connects the rechargeable battery to the DC/DC converter; the DC/DC converter converting an input DC voltage supplied by the at least one primary power source into an output DC voltage supplied to the secondary electrical network, the at least one primary power source and the rechargeable battery being connected in parallel to at least one electrical load and being configured to supply, via the electrical network, DC voltage and DC current to said at least one electrical load, said electrical system further comprises sensors to measure an output DC current and the output DC voltage supplied by the DC/DC converter, and further comprises at least one control unit connected to the sensors and able to control at least the DC/DC converter, said method comprising the following steps:
  a. controlling the DC/DC converter to reduce the output DC voltage from an actual voltage down to a target DC voltage;
  b. maintaining the target DC voltage during a first predetermined period of time;
  c. measuring the output DC current during the first predetermined period of time;
  d. determining, within the first predetermined period of time, a time during which the output DC current value is remained lower than a predetermined threshold current value;
  e. comparing the time during which the output DC current value is remained lower than the predetermined threshold current value with a second predetermined period of time;
  f. determining that the rechargeable battery is failed if the time during which the output DC current value is remained lower than the predetermined threshold current value is shorter than the second predetermined period of time.

According to an aspect of the invention, one benefit of this diagnosis method is that the existing control unit of the system and existing sensors embedded in the DC/DC converter will be enough to implement the method.

According to an aspect of the invention, another benefit of this diagnosis method is that it can be performed on the live system without service interruption.

According to an aspect of the invention, the state of the rechargeable battery is considered operational if the output DC current has been lower than the predetermined threshold current value during a time, that is longer than the second predetermined period of time; indeed, this implies that during this time during which the output DC voltage was maintained down to the target DC voltage, the rechargeable battery has supplied enough current to supply the set of electrical loads, and compensate for reduction of DC current under the predetermined threshold current value.

According to an aspect of the invention, the target DC voltage is chosen such that it is comprised between 70% and 95% of the nominal tension of the rechargeable battery, preferably between 75% and 85% of the nominal tension of the rechargeable battery. The target value is determined to be the lowest voltage possible within the operating range of all the systems connected to the low voltage network. The aim is to select the lowest voltage possible without disrupting the low voltage network.

According to an aspect of the invention, the first predetermined period of time lasts preferably more than 50 ms (milliseconds).

According to an aspect of the invention, the first predetermined period of time is more preferably comprised between 90 ms and 150 ms.

A minimum duration of 50 ms is necessary to take into account the time between the emission of the control signal to control the DC/DC converter to reduce the output DC voltage from an actual voltage down to a target DC voltage and the voltage adjustment at the DC/DC converter output and to take into account the capacitive effect on the network which might sustain the voltage temporarily. A first predetermined period of time that preferably lasts a maximum of 150 ms is sufficient to obtain a reliable result about the state of the rechargeable battery. The first predetermined period of time can be above 150 ms but it doesn't increase significantly the reliability of the result whereas a duration above 150 ms might cause some disruptions in the electrical system, especially if an extra power is requested by several loads.

According to an aspect of the invention, during step a) the output DC voltage is reduced from a current voltage down to a target DC voltage at a predetermined decreasing rate.

According to an aspect of the invention, the predetermined decreasing rate is comprised between 0.5 V/s and 5V/s.

According to an aspect of the invention, the predetermined decreasing rate is comprised between 1 V/s and 3 V/s.

According to an aspect of the invention, the second predetermined period of time preferably lasts at least 10 ms.

According to an aspect of the invention, the second predetermined period of time is, more preferably, comprised between 40 ms and 100 ms.

A second predetermined period of time that lasts at least 10 ms is preferred in order to obtain reliable results for the state of the rechargeable battery.

A second predetermined period of time that preferably lasts a maximum of 100 ms is sufficient to obtain a reliable result about the state of the rechargeable battery. The second predetermined period of time can be above 100 ms, but it doesn't increase significantly the reliability of the results obtained by the present method.

According to an aspect of the invention, the DC/DC converter delivers a nominal output DC voltage, and the method further comprises the following steps to be realised before step a. of reducing the output DC voltage:

1. Measuring an output DC voltage of the DC/DC converter;
2. Comparing said output DC voltage of the DC/DC converter to a predetermined threshold voltage value;
3. If output DC voltage is higher than said predetermined threshold voltage value, continuing the method and carrying out steps a. to f. and if output DC voltage is lower than said predetermined threshold voltage value aborting the method without carrying out steps a. to f.

According to an aspect of the invention, if the output DC voltage is lower than a predetermined threshold voltage value, initial conditions to start the diagnostic are considered insufficient to execute the diagnostic method and the state of the rechargeable battery is considered to be failed. Indeed, if the output DC voltage is lower than a predetermined threshold voltage value, according to the method, we are not able to reduce the output DC voltage from a current voltage down to a target DC voltage. The method can be applied only if the network voltage output is above said predetermined threshold voltage value.

According to an aspect of the invention, the predetermined threshold voltage value is equal to the nominal output DC voltage minus a value comprised between 5% and 30% of the nominal voltage.

According to an aspect of the invention, the system further comprises an electric actuator for moving an equipment, and the at least one control unit further controls the actuator, the method is triggered and started with step a. of claim 1 or with step 1. of claim 9 following an operator request to stop the system, the method further comprises the following steps to be executed after the step f. of determining that the rechargeable battery is failed:

g. requesting the operator to put the equipment on the ground before shutting down the primary power source;
h. receiving the confirmation that the equipment is on the ground;
i. shutting down the primary power source after having received the confirmation that the equipment is on the ground.

According to an aspect of the invention, if the outcome of step f. is that the state of the rechargeable battery is considered failed, the operator is informed that the equipment must be put down to the ground before stopping the system and the primary power source is then shut down by the electrical system only after having received the confirmation that the equipment is on the ground. Said confirmation can be received by the user via a HMI interface arranged in the cabin of the vehicle or by at least one sensor detecting the ground position of the equipment.

The invention also concerns a computer program to be executed on at least one control unit for evaluating a state of a charge of a rechargeable battery on a system, the computer program comprising program code means suitable for executing a method according to the invention.

The invention also concerns a computer-readable means comprising a recorded computer program, said computer-readable means comprising program code means suitable for performing the method according to the invention, when said recorded computer program is executed by at least one control unit.

The invention also concerns a vehicle comprising an electrical system, said electrical system comprising at least one primary power source and a rechargeable battery as secondary power source, DC/DC converter and an electrical network comprising a primary electrical network that connects the primary power source to the DC/DC converter and a secondary electrical network that connects the rechargeable battery to the DC/DC converter; the DC/DC converter converting an input DC voltage supplied by the at least one primary power source into an output DC voltage supplied to the secondary electrical network, the at least one primary power source and the rechargeable battery being connected in parallel to at least one electrical load and being configured to supply, via the electrical network, DC voltage and DC current to said at least one electrical load, said system further comprising sensors to measure an output DC current and the output DC voltage, and further comprising at least one control unit controlling the sensors and the power sources, and executing a computer program comprising program code means suitable for executing a method according to the invention.

According to an aspect of the invention, the vehicle is an excavator construction machine, the system further comprises at least one electric actuator for moving bucket of the vehicle, the at least one control unit executes preferably a computer program comprising program code means suitable for executing a method according to the invention. Preferably, the at least one control unit also controls the electric actuator. In a variant, the electric actuator is controlled by a different control unit.

Further advantages and advantageous features of the invention are disclosed in the following description and in the dependent claims.

BRIEF DESCRIPTION OF THE DRAWINGS

Below follows a more detailed description of embodiments of the invention cited as examples, in reference to the figures.

DETAILED DESCRIPTION OF EXAMPLE EMBODIMENTS OF THE INVENTION

Figure 1:
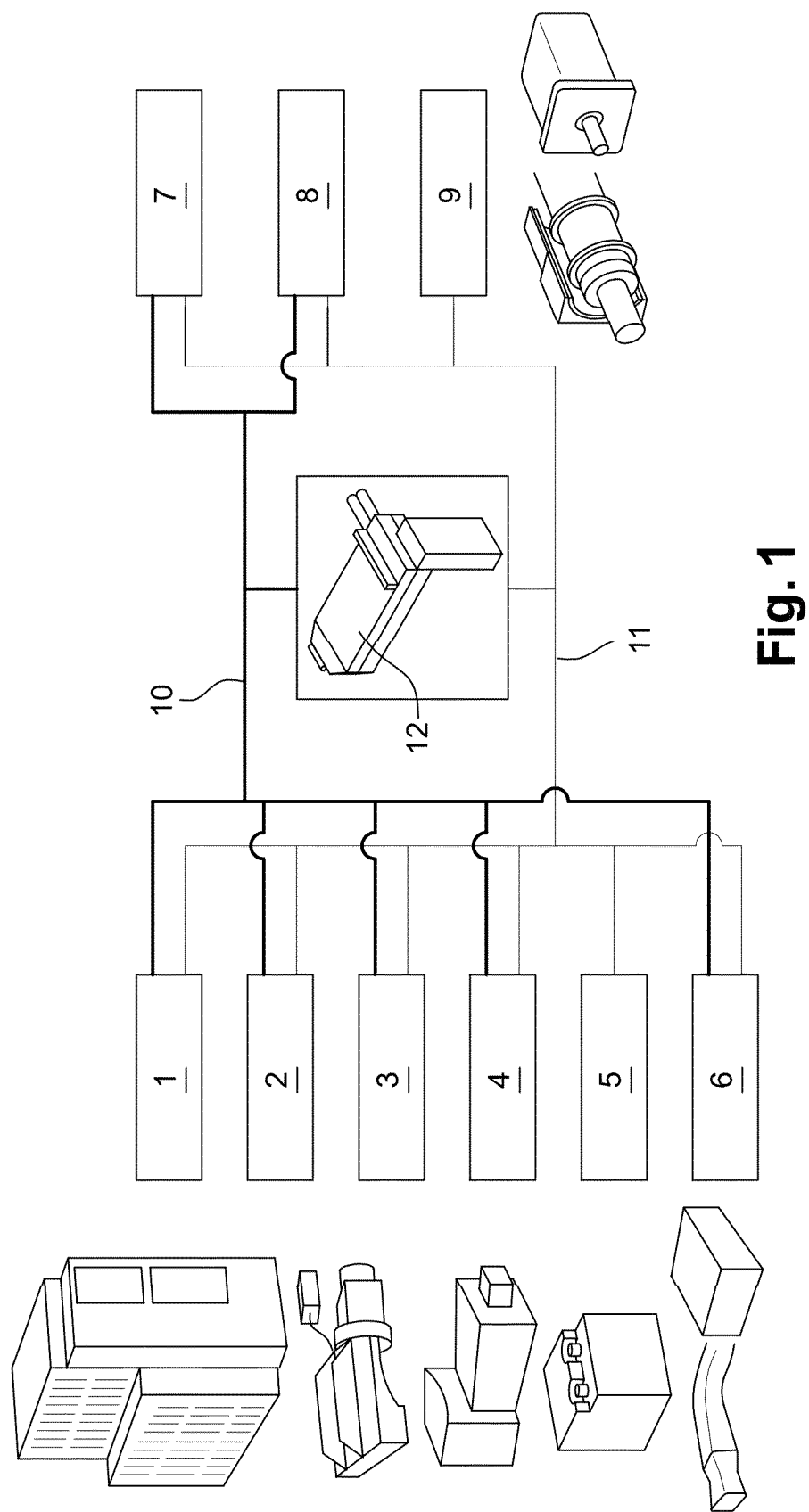
FIG. 1 is a schematic view of a system comprising different electrical power sources supplying two networks of actuators and accessories, and a DC/DC converter.

FIG. 1 represents a schematic view of an example embodiment of an electrical system according to the invention that can be arranged in a hybrid or full electric vehicle such as a hybrid or electric construction machine.

An electrical system according to the invention may comprise different kinds of electrical power sources, such as for instance a permanent high voltage battery 1, a secondary high voltage battery 2, a thermal range extender 3, a fuel cell unit 4, a low voltage rechargeable battery 5, and an integrated charger 6. The permanent high voltage battery 1 and the secondary high voltage battery 2 can be, for instance, 600V batteries. The low voltage rechargeable battery 5 can be, for instance, a 24V battery.

All these different sources supply electrical power to two different networks. The high voltage batteries 1, 2 are connected to a first network that is a high-voltage network 10 supplying 600 V to different electric actuators, such as, for example, a linear actuator 7, and a rotational actuator 8. The second network is a low-voltage network 11 supplying 24V to other accessories 9 such as radio, lights inside the cabin, heaters, air conditioning system, control units of the vehicle.

A DC/DC converter 12 is converting 600 VDC high-voltage DC input into 24 VDC low-voltage DC output that supplies the low-voltage network. The low-voltage network can also be supplied in 24 VDC by the 24V battery.

In other embodiments of the electrical system according to the invention, high-voltage values can as well be 48 VDC, 158 VDC, or 334 VDC, or 400 VDC or any other value instead of 600 VDC; low-voltage value can as well be 12 VDC, or some other values instead of 24 VDC.

The electrical system may also comprise a power source provided by the national electricity distribution network, supplying 230 VAC that is then converted to 600 VDC via a dedicated 230 VAC/600 VDC converter.

The 600 VDC/24 VDC converter is provided with embedded sensors monitoring the converter's input voltage and current, and/or the converter's output voltage and current. These sensors can communicate the measured values to a control unit of the system, controlling the sensors, the actuators, the power sources and the converter, namely their activation and/or their DC voltages.

An electrical system comprising at least one of the above mentioned 600 VDC sources, supplying a high-voltage network, and a rechargeable 24 VDC battery, supplying a low-voltage network, with a 600 VDC/24 VDC converter also supplying the low-voltage network, may be installed, with a control unit, on a machinery platform or a vehicle, for example a construction machine such as an excavator manipulating an equipment, such as a bucket, attached to it, and driven by the system through at least one electric actuator.

The 24 VDC rechargeable battery is used when the 600 VDC sources are inactive, to supply some accessories, such as a radio or a light inside an operator's cabin; it is also used to activate the 600 VDC network. Once the 600 VDC network is activated, it becomes the main power supplier for the actuators and for the accessories via the DC/DC converter, but also to charge, as much as necessary, the 24 VDC rechargeable battery. The 24 VDC rechargeable battery is then only used as back-up and/or for buffer-storing in the case of peak loads.

It may happen that the state of health of the 24 VDC rechargeable battery is such that it does not get charged anymore.

In one example embodiment of the invention, it is mandatory to avoid shutdown of the high-voltage network before having complied with safety regulations, in case the 24 VDC rechargeable is not charged enough to be capable of re-activating the high-level voltage network. Complying with safety regulations may for example mean putting to the ground the equipment attached to the construction machine, such as an excavator machine equipped with a bucket. Indeed, if this is not done before shutting down the high-voltage network, whereas the 24 VDC rechargeable battery is not able to re-activate this high-voltage network, then the excavator machine will be parked in a non-compliant configuration, and it will become very difficult to make it compliant with safety regulations. The high-voltage network is considered as being shutdown when it is disconnected from its high power source such as the high voltage batteries 1, 2. A way of shutting down the high-voltage network consists in disconnecting it from the high power source via, for instance, an electric contactor that is controlled by an ECU of the low voltage network.

Therefore, to avoid getting into this situation, the method according to the invention consists in automatically controlling the state of charge of the rechargeable battery before stopping the system, and without any service interruption.

Figure 2:
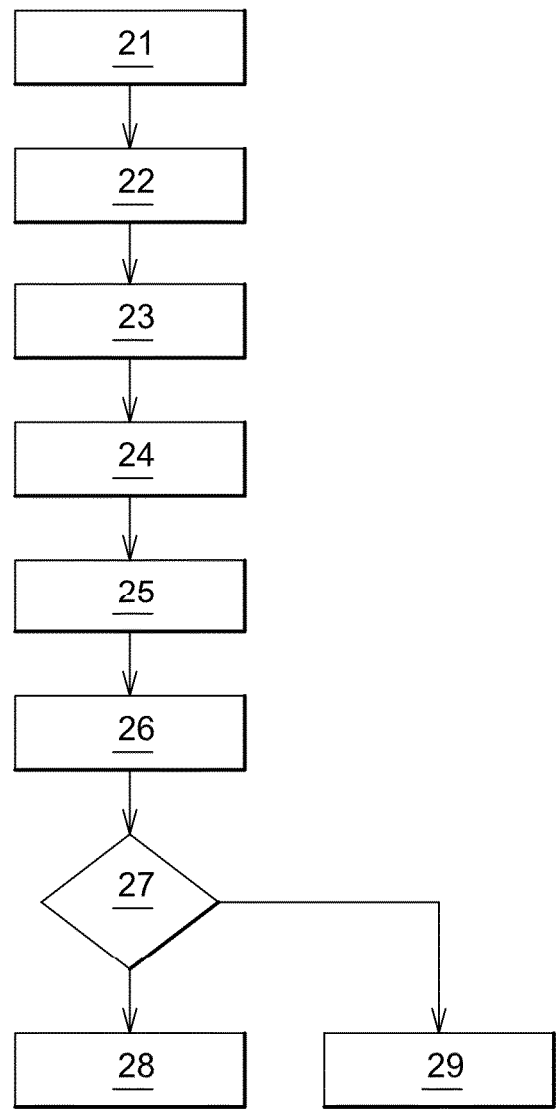
FIG. 2 is a block diagram representation of the method according to the invention

In a first embodiment, the method comprises the following steps, as represented by the block diagram of FIG. 2:

a first step 23 consists in controlling the DC/DC converter to reduce the output DC voltage from a current voltage down to a target DC voltage;

a second step 24 consists in maintaining the control of the output voltage of the DC/DC converter at the target DC voltage during a first predetermined period of time;

a third step 25 consists is measuring the output DC current, supplied by the converter 12, during the first predetermined period of time.

In this example embodiment of the invention, during first step 23, the DC/DC converter is controlled to reduce the output DC voltage from a current voltage down to a target DC voltage. The target value is determined to be the lowest voltage possible within the operating range of all the systems connected to the low voltage network. The aim is to select the lowest voltage possible without disrupting the low voltage network. To this end and according to the invention, the target value will be preferably chosen to be comprised between 70% and 95% of the nominal tension of the rechargeable battery, preferably between 75% and 85% of the nominal tension of the rechargeable battery. As an example, the rechargeable battery is a 24 VDC battery, in this case the target value can be comprised between 16.8V and 22.8V, preferably between 18 and 20.4V, for instance, the target value can be about 18.6V. Preferably, the output DC voltage is reduced from the current voltage down to the target DC voltage at a predetermined decreasing rate that is comprised between 0.5 V/s and 5V/s, preferably between 1 V/s and 3 V/s, and more preferably around 2V/s.

In a fourth step 26 the control unit will determine, within the first predetermined period of time, a time during which the output DC current value is remained lower than a predetermined threshold current value; the control unit will then evaluate the state of charge of the rechargeable battery depending on how long the DC current value is remained lower than the predetermined threshold current value;

To this aim, in a fifth step 27, the control unit will compare with a second predetermined period of time, the time during which the output DC current value is remained lower than the predetermined threshold current value.

It is assumed that the low-voltage network requires a minimum operational voltage and a minimum operational current to remain operational; the target DC voltage is set to be equal to this minimum operational voltage, and the predetermined threshold current value is set to be lower than this minimum operational current.

The state of the rechargeable battery is considered operational, step 28, if the output DC current has been lower than the predetermined threshold current value during a time that is longer than the second predetermined period of time. Indeed, this implies that during the time when the output DC current value is remained lower than the predetermined threshold current value and when the output DC voltage was maintained down to the target DC voltage, the rechargeable battery has supplied enough current to supply the set of electrical loads, and compensate for reduction of DC current under the predetermined threshold current value so as to maintain the system operational.

On the contrary, the state of the rechargeable battery is considered as failed, step 29, if the output DC current has been lower than the predetermined threshold current value during a time that is shorter than the second predetermined period of time.

On the low-voltage network, it is expected that there is always consumers on the network. This is in general the case. This means that current is drawn from the network.

When the DC/DC converter is controlled to ramp down to the target DC voltage in first step 23, it is requested in second step 24 to maintain this target DC voltage during a first predetermined period of time, to cater for the following:
1. the time between the DC/DC converter request to ramp down and the DC/DC converter output,
2. the capacitive effect on the network which might sustain the voltage temporarily until eventually the battery is drawn.

A minimum duration of 50 ms is determined to take into account the capacitive effect;

Conversely, above 150 ms might cause some disruptions in the electrical system without significantly increasing the reliability of the results given by the present method.

Therefore, in this example embodiment of the invention, the first predetermined period of time lasts more than 50 ms, preferably the first predetermined period of time is comprised between 90 ms and 150 ms, more preferably around 100 ms.

The second predetermined period of time introduced in fifth step 27 is determined by the need to filter out current peaks, in case there has been a peak current draw following a load starting up.

Therefore, in this example embodiment of the invention, the second predetermined period of time lasts more than 10 ms in order to obtain reliable results for the state of the rechargeable battery and is preferably comprised between 40 ms and 100 ms and is more preferably about 50 ms.

In a second embodiment of the invention, before the execution of the first step 23, and according to an additional and previous step 21, the execution of the first step 23 of the method is preferably triggered by a request from the operator requiring the system to stop. The operator's request can be indicated via, for instance, a dedicated key being rotated or via a dedicated button being pressed.

In an alternative of the invention, first step 23 of the invention can be periodically and automatically triggered while the electrical system is still activated and without receiving any specific request from the operator. In this case and when step 23 is initiated or about to be initiated, the control unit controls the different loads of the vehicle to maintain them in their current states to avoid power variation in the electric networks.

In a further improvement of the invention, a further step 22, that is preferably executed before first step 23, consists in checking that some initial conditions before executing steps 23 to 27 of the present methods are met.

To this end, the further step 22 comprises the sub-steps of:
1. measuring the output DC voltage of the DC/DC converter,
2. comparing the output DC voltage to a predetermined threshold voltage value,
3. based on the result of the comparison between the output DC voltage, determining if initial conditions are met to execute the next steps of the method.

If the output DC voltage is lower than said predetermined threshold voltage value, it is determined that initial conditions are insufficient to execute the next steps of the method. In this case, the method is aborted without carrying out the next steps of the method. Indeed, if the output DC voltage is lower than a predetermined threshold voltage value, according to the method we are not able to reduce the output DC voltage from a current voltage down to a target DC voltage. The method can be applied only if the network voltage output is above said predetermined threshold voltage value.

On the contrary, if the output DC voltage is higher than the predetermined threshold voltage value, it is determined that conditions are met to execute the next steps of the method. The next step 23 of the method is then executed.

The predetermined threshold voltage value is preferably determined at a value that is lower than the nominal or reference output DC voltage. The predetermined threshold voltage value can be determined between 5% and 30% below the nominal or reference output DC voltage. The threshold voltage value may be, for instance, about 18.6 V when the nominal or reference output DC voltage is 24V.

If according to previous step 21, the method is triggered by a request from the operator requiring the system to stop, the further step 22 takes place after previous step 21.

As indicated in FIG. 2, in a further improvement of the invention, depending on the outcome of fifth step 27, the method according to this improvement of the invention executes one of the two following steps:

Sixth step 28, if the state of the rechargeable battery is evaluated operational, the machine can be stopped with no other action;

Seventh step 29, if the state of the rechargeable battery is evaluated failed, the method comprises the following sub-steps:
  requesting from the operator to put the equipment on the ground before automatically shutting down the primary power source 1, 2;
  receiving, via, for instance, a HMI interface in the cabin of the vehicle, a confirmation from the operator that the equipment of the machine has been put on the ground;
  when it is confirmed that the equipment is on the ground, shutting down the primary power source 1, 2.

After the evaluation of the state of charge of the rechargeable battery, the output DC voltage is reset to the nominal output DC voltage supplied by the converter 12.

The invention claimed is:

1. A method for evaluating a state of charge of a rechargeable battery of an electrical system, said electrical system comprising at least one primary power source and a rechargeable battery as a secondary power source, a DC/DC converter and an electrical network comprising a primary electrical network that connects the primary power source to the DC/DC converter and a secondary electrical network that connects the rechargeable battery to at least the DC/DC converter; the DC/DC converter converting an input DC voltage supplied by the at least one primary power source into an output DC voltage supplied to the secondary electrical network, the at least one primary power source and the rechargeable battery being connected in parallel to at least one electrical load and being configured to supply, via the electrical network, DC voltage and DC current to said at least one electrical load, said electrical system further comprising sensors to measure an output DC current and the output DC voltage supplied by the DC/DC converter, and further comprising at least one control unit connected to the sensors and able to control at least the DC/DC converter, said method comprising:
  a. controlling the DC/DC converter to reduce the output DC voltage from an actual voltage down to a target DC voltage;
  b. maintaining the target DC voltage during a first predetermined period of time;
  c. measuring the output DC current during the first predetermined period of time;
  d. determining, within the first predetermined period of time, a time during which an output DC current value of the output DC current is remained lower than a predetermined threshold current value;
  e. comparing the time during which the output DC current value is remained lower than the predetermined threshold current value with a second predetermined period of time; and
  f. determining that the rechargeable battery is failed if the time during which, the output DC current value is remained lower than the predetermined threshold current value, is shorter than the second predetermined period of time.

2. A method according to claim 1, wherein the target DC voltage is chosen to be comprised between 70% and 95% of the nominal tension of the rechargeable battery.

3. A method according to claim 1, wherein the first predetermined period of time lasts more than 50 ms.

4. A method according to claim 1, wherein during step a) the output DC voltage is reduced from a current voltage down to a target DC voltage at a predetermined decreasing rate.

5. A method according to claim 4, wherein the predetermined decreasing rate is comprised between 0.5 V/s and 5V/s.

6. A method according to claim 5, wherein the predetermined decreasing rate is comprised between 1 V/s and 3 V/s.

7. A method according to claim 1, wherein the second predetermined period of time lasts at least 10 ms.

8. A method according to claim 7, wherein the second predetermined period of time is comprised between 40 ms and 100 ms.

9. A method according to claim 1, wherein the DC/DC converter delivers a nominal output DC voltage, the method further comprising, before step a. of reducing the output DC voltage:
  1. Measuring an output DC voltage of the DC/DC converter;
  2. Comparing said output DC voltage of the DC/DC converter to a predetermined threshold voltage value; and
  3. If output DC voltage is higher than said predetermined threshold voltage value, continuing the method and carrying out steps a. to f. and if output DC voltage is lower than said predetermined threshold voltage value, aborting the method without carrying out steps a. to f.

10. A method according to claim 1, the system further comprising an electric actuator for moving an equipment, the method is triggered and started with step a. of claim 1 or with step 1. of claim 9 following an operator request to stop the system, the method further comprising, after the step f. of determining that the rechargeable battery is failed:
  g. requesting from the operator to put the equipment on the ground before shutting down the primary power source;
  h. receiving the confirmation that the equipment is on the ground; and
  i. shutting down the primary power source after having received the confirmation that the equipment is on the ground.

11. A non-transitory computer program to be executed on at least one control unit for evaluating a state of charge of a rechargeable battery on a system, the computer program comprising program code means suitable for executing a method according to claim 10.

12. A non-transitory computer program to be executed on at least one control unit for evaluating a state of charge of a rechargeable battery on a system, the computer program comprising program code means suitable for executing a method according to claim 1.

13. Non-transitory computer-readable means comprising a recorded computer program comprising program code means suitable for performing the method according to claim 1, when said recorded computer program is executed by at least one control unit.

14. A vehicle comprising an electrical system, said electrical system comprising at least one primary power source and a rechargeable battery as secondary power source, a DC/DC converter and an electrical network comprising a primary electrical network that connects the primary power source to the DC/DC converter and a secondary electrical network that connects the rechargeable battery to the DC/DC converter; the DC/DC converter converting an input DC voltage supplied by the at least one primary power source into an output DC voltage supplied to the secondary electrical network, the at least one primary power source and the rechargeable battery being connected in parallel to at least one electrical load and being configured to supply, via the electrical network, DC voltage and DC current to said at least one electrical load, said system further comprising sensors to measure an output DC current and the output DC voltage, and further comprising at least one control unit controlling the sensors and the power sources, and executing a computer program according to claim 12.

15. A vehicle according to claim 14, wherein the vehicle is an excavator construction machine, the system further comprises at least one electric actuator for moving a bucket of the vehicle, the at least one control unit, executes a computer program according to claim 11.

16. A vehicle according to claim 15, wherein the at least one control unit controls the electric actuator.

* * * * *